United States Patent [19]

Kilcup

[11] 4,365,173
[45] Dec. 21, 1982

[54] PHASE SHIFTER ADJUSTMENT APPARATUS

[75] Inventor: Richard G. Kilcup, Glen Burnie, Md.

[73] Assignee: The United States of America as represented by the Secretary of the Air Force, Washington, D.C.

[21] Appl. No.: 256,881

[22] Filed: Apr. 24, 1981

[51] Int. Cl.³ .............................................. H01P 1/32
[52] U.S. Cl. .................................................. 307/412
[58] Field of Search ....................... 307/412; 333/24.1

[56] References Cited

U.S. PATENT DOCUMENTS

| | | | |
|---|---|---|---|
| 3,109,934 | 11/1963 | Holcomb | 307/412 X |
| 3,221,176 | 11/1965 | Fritz et al. | 307/412 |
| 3,521,079 | 7/1970 | Kuck | 307/412 |
| 4,042,831 | 8/1977 | Lenhoff | 307/412 |

*Primary Examiner*—Donald A. Griffin
*Attorney, Agent, or Firm*—Donald J. Singer; William Stepanishen

[57] ABSTRACT

A phase shifter adjustment apparatus utilizing a current source bleed unit to control microwave ferrite phase shifter coils without elongating the switching time. The current sources provide a high impedance to the phase shifter coils thereby minimizing RL time constants.

12 Claims, 15 Drawing Figures

FIG.1.a PRIOR ART

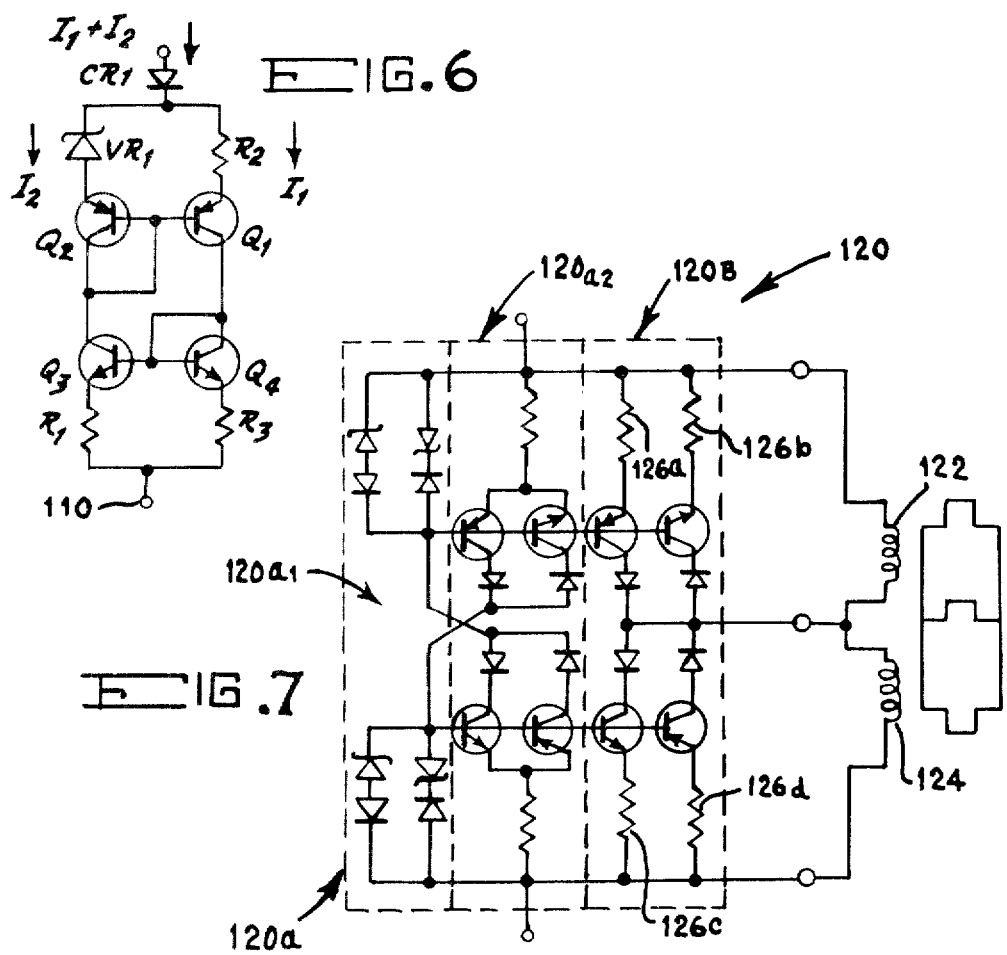
FIG.6
FIG.7
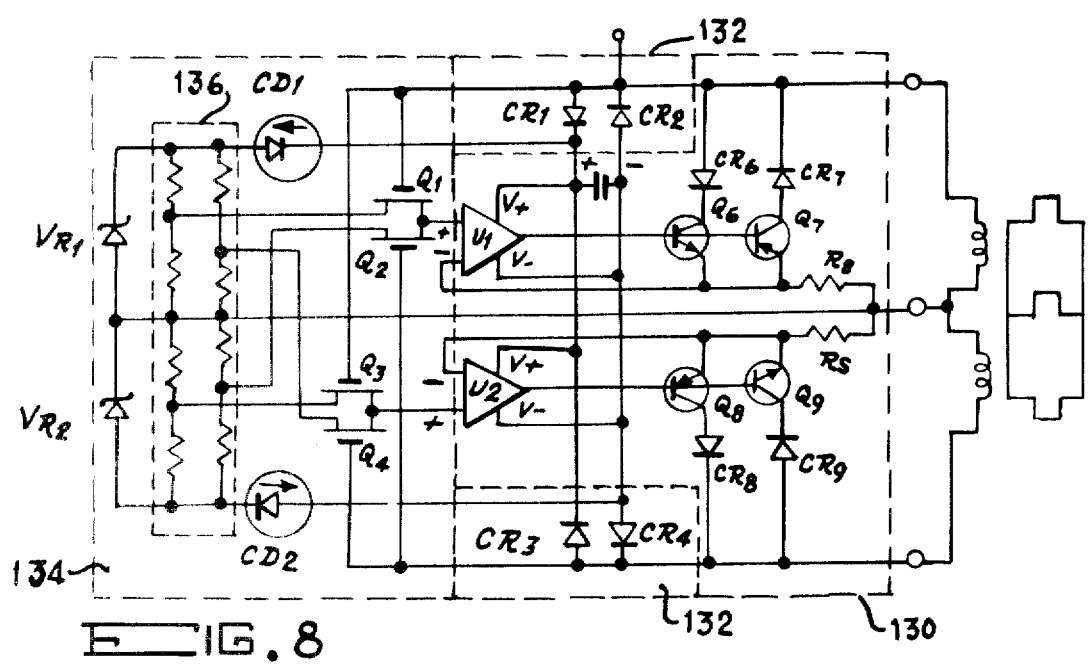
FIG.8

PHASE SHIFTER ADJUSTMENT APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates to a phase control circuit, and in particular to a phase shifter adjustment apparatus for a microwave ferrite antenna system.

In the prior art, radar antennas used ferrite phase shifters to change the phase of microwave energy entering the antenna in order to direct the propagation slightly off boresight, thereby determining the direction in which the antenna must be moved when tracking a target. Alternatively, the energy may be transmitted along boresight and the beam directed off boresight when receiving only (LOR, i.e., lobe-on-receive). Generally, phase shifters used for this purpose contain two control coils which generate respectively an axial magnetic control field and a transverse magnetic control field in a low-hysteresis ferrite material, and current must be applied continuously to the coils during operation. The phase shift to energy passing in the transmit direction is approximately independent of coil current, whereas the phase shift to energy passing in the receive direction is highly dependent on coil current. Ordinarily, each phase shifter is driven at a constant current level, but of either polarity, depending on the direction in which the beam is to be aimed at that time. Rapid phase-switching speeds are desirable because more time is left for radar pulsing.

In one radar, which led to the invention, the parameters of the ferrite and manufacturing processes precluded interchangeability of phase shifters unless coil-current adjustments could be made internal to the phase shifter itself. Diodes and resistors were used in parallel with each coil such that, for a constant input current, the current in each coil could be adjusted by bleeding unwanted current past the coil. Four diodes and four selected resistors total were required to adjust for both current polarities of both coils. The increased drive current requirement overtaxed the existing driver's power dissipation, requiring redesign, and the LR time constant internal to the phase shifter were so long that the coil currents could not decay fast enough to complete the phase switching in the time alloted. Also, the bleed currents varied with temperature due to the diode thermal characteristics. The solution adapted in this system was to purchase phase shifters in matched sets of four (4), and replace all four (the entire set) if one malfunctioned, i.e., interchangeability was abandoned.

The present invention provides a means for full adjustment, and therefore full interchangeability, of low-hysteresis type microwave ferrite phase shifters without the degrading effects described above and with the added benefit of temperature compensation, if desired.

SUMMARY OF THE INVENTION

The present invention utilizes a constant current source to control the coil current in coils of each microwave ferrite phase shifter unit. A constant current source is placed in parallel to the phase shifter coils to control the amount of current flowing in the respective coils for different polarity of drive voltage. The switching of the drive and control currents to the coils would be a function of the polarity of the applied drive voltage to the coils. The control of the coil current in each of the two coils may be achieved by arranging the constant current source to either bleed current in a given direction from the coils or to directly control the current that is applied to the coils. The current in each coil must be independently adjustable for each polarity of drive voltage, for a total of four independent constant current adjustments.

It is one object of the present invention, therefore, to provide an improved phase shifter adjustment apparatus.

It is another object of the invention to provide an improved phase shifter adjustment apparatus utilizing a constant current source to control coil current in a ferrite phase shifter.

It is still another object of the invention to provide an improved phase shifter apparatus wherein the adjustment of current in each coil is independently adjusted for each polarity of drive voltage.

It is yet another object of the invention to provide an improved phase shifter apparatus which is temperature independent.

It is a further object of the invention to provide an improved phase shifter apparatus which is completely interchangeable without current settling time mismatches.

It is still a further object of the invention to provide an improved phase shifter adjustment apparatus to control the amount of current flowing in the phase shifter coil according to the polarity of the drive voltage.

It is an even further object of the invention to provide an improved phase shifter adjustment apparatus wherein the switching of the drive and control current to the phase shifter coil is a function of the polarity of the drive voltage.

These and other advantages, objects and features of the invention will become more apparent after considering the following description taken in conjunction with the illustrative embodiment in the accompanying drawings.

BRIEF DESCRIPTION OF THE DRAWINGS

FIG. 1a is a schematic diagram of a prior art phase shifter unit;

FIG. 1b is a graphic representation of the microwave phase shift versus the coil current of the prior art phase shifter unit in FIG. 1a;

FIG. 6 is a schematic diagram of a unidirectional constant current source;

FIG. 7 is a schematic diagram of a control circuit and a bleed current circuit to maintain a constant current in the coil units; and FIG. 8 is a schematic diagram of a bleed current control circuit with a control unit utilizing operational amplifiers and MOSFET reference switching.

DESCRIPTION OF THE PREFERRED EMBODIMENT

In FIG. 1a, there is shown a schematic diagram of a pair of microwave ferrite phase shifters of the type used in the prior art to adjust the antenna receive-beam to boresight position and four lobing positions. The phase shifter unit comprises a first and second ferrite core unit 10, 12 and a first and second control coil 14, 16. The microwave transmit direction and the microwave receive direction is indicated with respect to the ferrite core units 10, 12. It may be noted that the phase shift current $I_{\phi s}$ equals the coil current $I_{coils}$. The intensity B of the magnetic field is indicated in each ferrite core unit 10, 12.

Figure 1B:
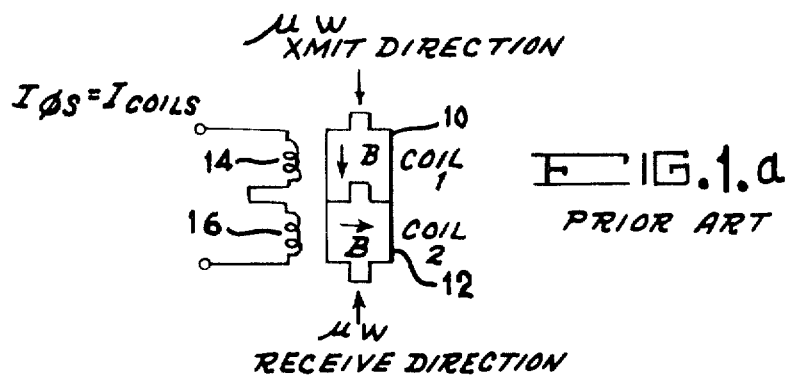
Figure 1B:
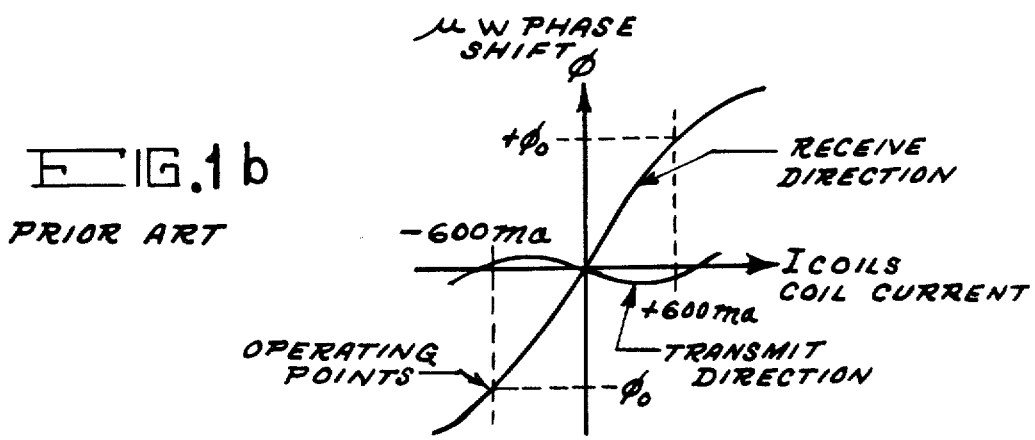

In FIG. 1b, there is shown in a graphical representation the relationship between the microwave phase shift $\phi$ and the coil current $I_{coils}$. There is shown a curve for the transmit direction and a curve for the receive direction. A D.C. current of 600 ma is applied to the axial-field and transverse-field coils 14, 16 which are connected in series. It may be noted that the receive-direction phase shift is substantially altered while the change in the transmit-direction phase shift is essentially negligible in comparison.

Figure 1C:
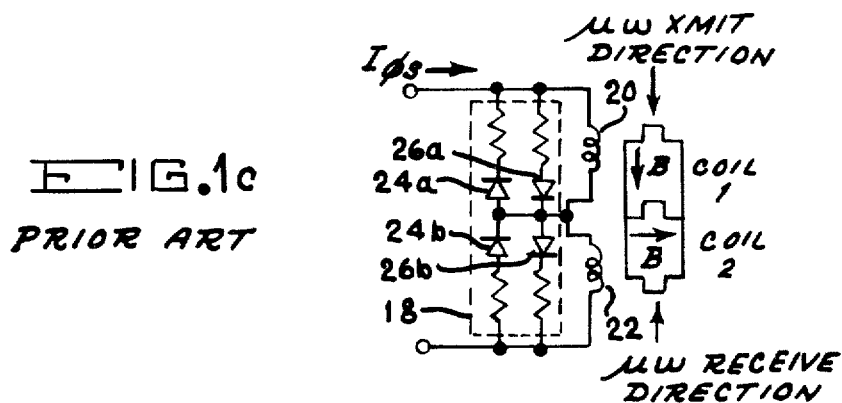
FIG. 1c is a schematic diagram of a prior art phase shifter with a passive adjustment network.

A prior art attempt to provide a phase shifter unit with a passive adjustment network is shown in FIG. 1c. A resistive network 18 is placed in parallel with the coils 20, 22 to control and provide adjustment of the current flowing through the coils 20, 22. In order to provide directional current control, diodes 24a, b and 26a, b were utilized to control current flow direction in the resistive network 18 and thereby in the coils 20, 22. The use of the resistive network 18 required that the phase shifter drive current be increased to 800 ma. A problem thus appeared due to the resistances in parallel with the coils, i.e., the R-L time constant was too long to allow the coil current to die out exponentially to the accuracy necessary for the microwave phase shift to fall within the specified tolerance in the 500 usec allowed switching time. Measurements with different phase shifters typically fell within the range of 700–900 usec. Thus, while a prior art adjustment network is provided, the operability of the phase shifter unit is severely degraded due to the increased power usage and switching time.

Figure 2:
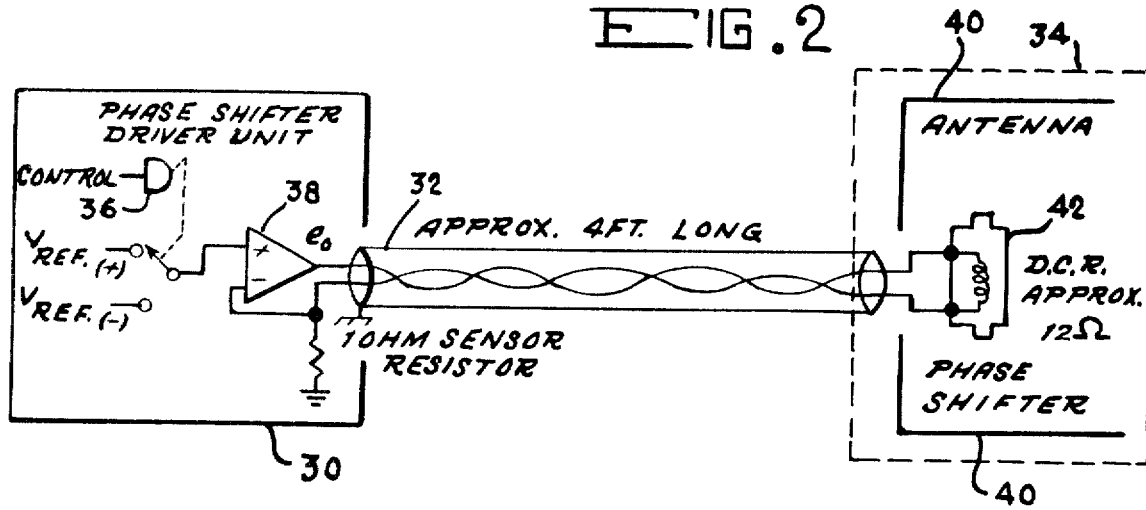
FIG. 2 is a simplified schematic diagram of a prior art phase shifter/antenna system.

There is shown in FIG. 2 a prior art system for driving a phase shifter antenna. A phase shifter driver unit 30 is connected by approximately four feet of two conductor cable 32 to a phase shifter antenna unit 34. The phase shifter driver unit 30 comprises a control unit 36, a positive and negative reference voltage, and a differential amplifier 38. The output voltage, $e_o$ from the differential amplifier 38 is approximately ±15 volts for maximum rate of change of current to the coils of the phase shifter 42 and is approximately ±7 volts for constant current control. The antenna unit 34 comprises antenna element 40 and a phase shifter unit 42. The phase shifter driver unit 30 is designed to apply a maximum voltage of ±15 volts to the coils of the phase shifter 42, in which the coils are connected in series with approximately 12 ohms D.C. total resistance. When the current in the cores reaches a new operating value, the phase shifter driver unit 30 decreases the voltage under feedback control to maintain a constant current through the phase shifter 42. Without the adjustment network, the phase shifter driver unit 30 switched the coil currents rapidly, according to $di/dt = e_o/L$, and held the current at the correct value until a new value was achieved. With the adjustment network however, the total current was switched in a slightly shorter time due to the resistances, but the phase shifter driver unit 30 no longer controlled the coil currents which died away exponentially.

Figure 3A:
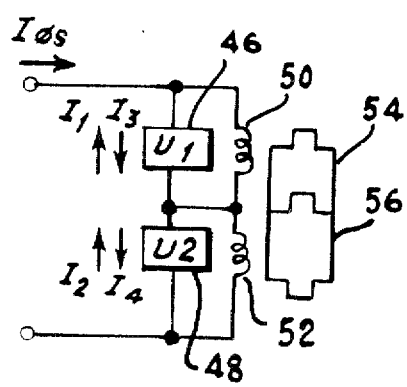
FIG. 3a is a block diagram of the phase shifter adjustment apparatus according to the present invention.
Figure 3B:
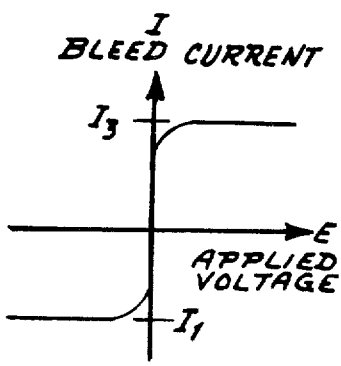
FIG. 3b is a graphical representation of the ideal transfer characteristics for a bidirectional constant-current source.

Referring now to FIG. 3a, there is shown a schematic diagram of a phase shifter adjustment unit utilizing a pair of bidirectional constant current sources 46, 48 in parallel with control coils 50, 52 which in turn control the state of the ferrite cores 54, 56. In FIG. 3b there is shown the transfer characteristics for the bidirectional current sources 46, 48 of FIGS. 3a in terms of bleed current, I versus applied voltage, E. Each current source 46, 48 provides a constant current for each polarity of applied drive voltage. Current source 46 provides constant currents $I_1$, $I_3$ with the current direction given as shown in FIG. 3a, while current source 46 provides the constant currents $I_2$, $I_4$.

The constant current sources 46, 48 are used to bleed current past the coils 50, 52 and to provide high-impedance to the driving source. One current source unit is provided for each coil of the phase shifter, and they would have to bleed a different current for each polarity of drive voltage. The steady-state coil voltage of 600 ma × 12 OHMS = 7.2 V would be sufficient to power the active circuitry of the current source, no extra power supply lines would be needed. The polarity of the applied voltage would perform the switching with no added control lines. The bleed current may also be made temperature-sensitive if temperature compensation were required.

Figure 3C:
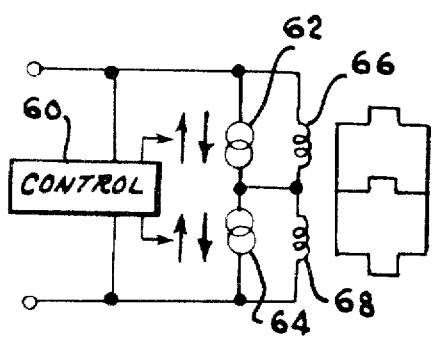
FIG. 3c is a block diagram of the phase shifter adjustment apparatus utilizing bidirectional constant-current sources and a control circuit.

In FIG. 3c, there is shown a bidirectional current source bleed circuit in which a control unit 60 has been added. The control unit 60 is utilized to control the constant sources 62, 64 and thereby control the current flowing in coils 66, 68. The control unit 60 may be any type of converted control circuit such as a feedback circuit, to control the bleed current in constant current sources 62, 64 to a constant value in the desired direction.

Figure 4:
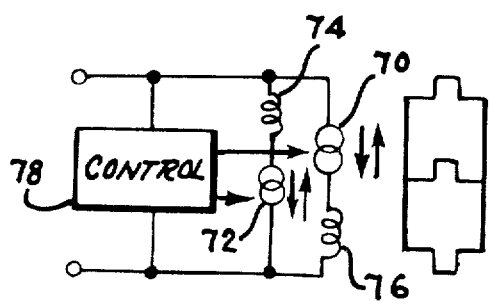
FIG. 4 is a block diagram of an alternative embodiment of the phase shifter apparatus utilizing bidirectional constant-current sources for coil current control.

Turning now to FIG. 4, there is shown a schematic of a phase shifter adjustment apparatus wherein coil current control is utilized. In this configuration the bidirectional constant current sources 70, 72 are in series with the ferrite phase shifter control coils 74, 76. A control unit 78 is provided to provide a constant coil current for the applied phase shifter drive voltage. The use of a circuit of this type now greatly reduces the requirements on the phase shifter driver unit which would become a voltage driver rather than a current driver.

Figure 5A:
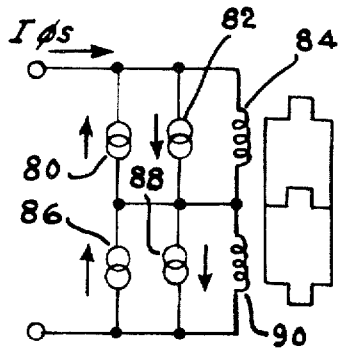
FIG. 5a is a schematic diagram of the phase shifter adjustment apparatus utilizing unidirectional constant-current sources as the bleed current control.

In FIG. 5a there is shown a schematic diagram of a phase shifter adjustment apparatus utilizing unidirectional constant current sources to provide bleed current control. When unidirectional constant current sources, such as unit 80, 82 are utilized to control the bleed current in ferrite phase shifter control coil 84, it is necessary that one unidirectional constant current source for each current direction be placed in parallel with the control coil. The ferrite phase shifter control coil 90 is shown with unidirectional constant current sources 86, 88 in parallel with it to control the bleed current therein. There is shown in FIG. 5b a graphical representation of the transfer characteristics of a unidirectional constant current source wherein the current is plotted against the applied voltage.

Figure 5C:
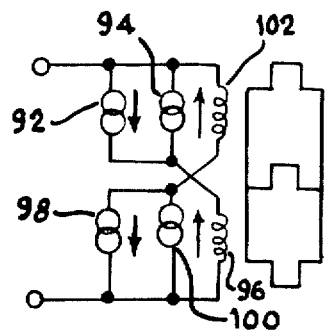
FIG. 5c is a schematic diagram of the phase shifter adjustment apparatus utilizing the unidirectional constant-current source for coil current control.
Figure 5B:
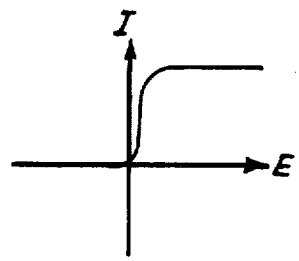
FIG. 5b is a graphical representation of the transfer characteristics for a unidirectional constant-current source.

In FIG. 5c, there is shown a schematic diagram of phase shifter adjustment apparatus utilizing unidirectional constant current sources for current control of the current flowing in each ferrite phase shifter control coil. In this configuration, it is required that two unidirectional constant current sources, which are in parallel with each other, be placed in series with a given phase shifter control coil. Thus, it may be seen that unidirectional constant current sources 92, 94 are of opposite current direction and are in parallel with each other, and are in series with control coil 96. The control coil 102 is in series with unidirectional constant current sources 98, 100 which are of opposite polarity and in parallel with each other.

Figure 5D:
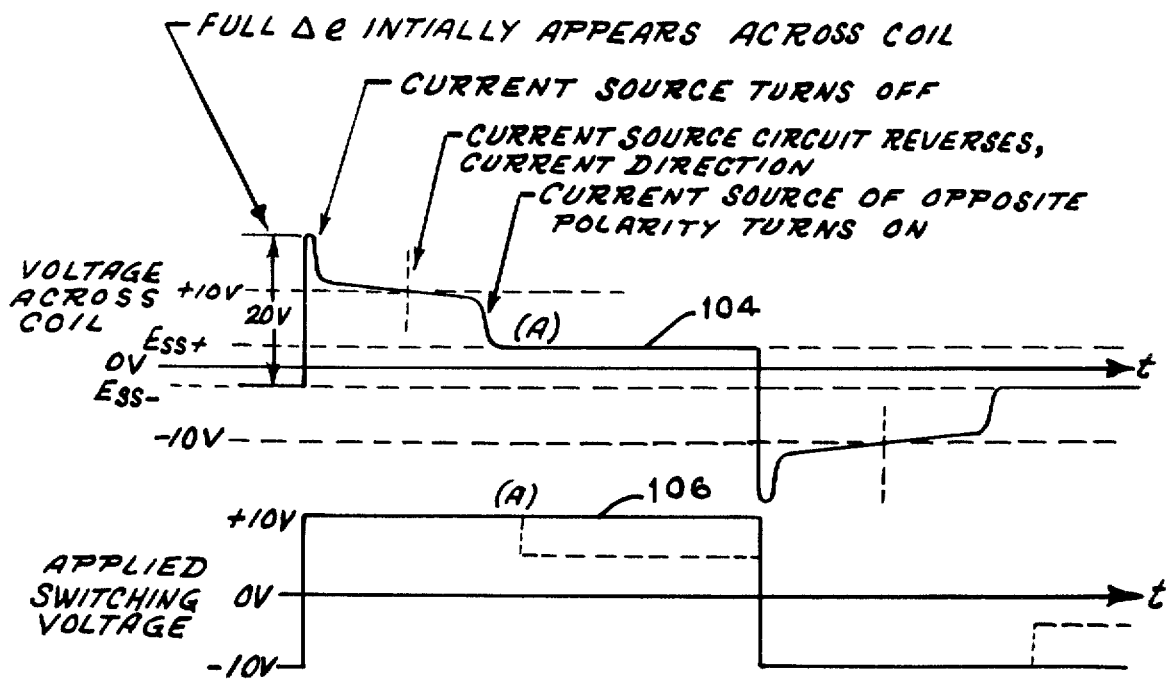
FIG. 5d is a graphical representation of the switching voltage waveforms in the phase shifter adjustment apparatus of FIGS. 5a and 5c.

In FIG. 5d, there is shown a graphical representation of the switching voltage waveforms that occur across the elements in FIG. 5c. Voltage waveform 104 represents the voltage changes that occur across the control coils 96, 102 at various points of circuit operation. When the full applied voltage appears across the control coil, the full value is 20 volts. At the time the current source turns off, the voltage value begins to drop sharply to about 10 volts and then begins to level off. About half way through this portion of the waveform, the current source circuit reverses current direction. When the current source of opposite polarity turns on, the voltage waveform drops sharply until the level Ess+ is reached.

Voltage waveform 106 represents the switching voltage that is applied to the input of the circuit shown in FIG. 5c. This switching voltage varies from +10 volts to −10 volts. During the interval that the applied switching voltage 106 is held at a constant +10 volt level the voltage across the coil varies as shown in voltage waveform 104. It may be noted that, at the time marked A on both waveforms 104, 106, the applied switching voltage could be automatically reduced to some lower value, such as ±5 volts, by the phase shifter driver unit to reduce the power dissipation in the constant current sources.

Turning now to FIG. 6, there is shown a schematic diagram of a transistor circuit which could be utilized to perform the function of a unidirectional constant current source. The unidirectional constant current source comprises a pair of parallel paths containing two transistors in series. Applying a voltage across the circuit which is positive at the anode of CR1 with respect to terminal 110 will cause current to flow in both paths, whereas reversing the voltage polarity causes negligible current equal to the reverse leakage of CR1. The interconnection of PNP transistors $Q_1$ and $Q_2$ causes the voltage across $R_2$ to equal the voltage across zener diode VR, thereby determining the value of $I_1$, to be equal to $E(VR)/R_2$. $Q_4$, $R_3$, $Q_3$, and $R_1$ act as a current-mirror circuit, wherein the current $I_2$ in the collector of $Q_3$ is constrained to be a fixed ratio of the current in the collector of $Q_4$, i.e., $I_2R_1 = I_1R_3$. Therefore the current $I_2$, which also passes through VR1, is also fixed and constant, increasing the accuracy of the current source. The total current, $I_1 + I_2$, will remain constant over a wide range of applied voltage. It should be noted that either $R_1$, $R_2$, or $R_3$ could be a temperature-sensitive resistance if temperature compensation is desired. In the present example of a unidirectional constant current source, it may be noted that transistors $Q_2$ and $Q_4$ could be diodes, and that diode CR1 could be two diodes in series with the collectors of transistors $Q_1$ and $Q_3$. The best operation would be obtained in most applications when current $I_1$ equals current $I_2$, because the transistor Vbe's would track better with temperature and power dissipation would be more uniformly distributed throughout the circuit.

In FIG. 7, there is shown a schematic diagram of a phase shifter adjustment apparatus 120 utilizing a combined control unit 120a and a bidirectional current source bleed unit 120b to control the current in coils 122, 124. The control unit 120a comprises a reference voltage unit $120a_1$, utilizing zener diodes and constant current sources $120a_2$. The constant current sources $120a_2$ are utilized to provide bias current to the reference zener diodes VR, . It would be possible to use a simple resistive network as the current sources if the total resistance in parallel with the coils were not too low. The bleed current sources 120b utilize resistors 126a–126d which are adjusted to provide a desired bleed current and may be temperature dependent networks to provide compensation.

Referring now to FIG. 8 there is shown a schematic diagram of a phase shifter adjustment apparatus utilizing a bleed current control circuit in combination with a control unit which employs operational amplifiers and MOSFET reference switching. The bleed-current controlled circuit 130 comprises bidirectional current sources (transistors $Q_6$–$Q_9$ and diodes CR6–CR9) and the operational amplifier feedback control unit (operational amplifiers U1, U2 and resistors $R_s$). A fullwave rectifier unit 132 which comprises rectifier diodes CR1–CR4, applies the correct voltage polarity to the operational amplifier U1, U2 and the voltage reference diodes VR1, VR2. The control unit 134 comprises MOSFETs $Q_1$–$Q_4$, constant-current diodes, CD1, CD2, a resistive network 136, and voltage reference diodes, VR1, VR2. The MOSFET transistors $Q_1$–$Q_4$ perform the reference voltage switching, but without interface circuitry, because the applied voltage is adequate to drive the gates directly. The constant current diodes CD1, CD2 maintain a constant current to the resistive network 136. The resistors utilized in the resistive network 136 are adjusted to provide the desired currents and may be temperature sensitive for compensation.

Although the invention has been described with reference to a particular embodiment, it will be understood to those skilled in the art that the invention is capable of a variety of alternative embodiments within the spirit and scope of the appended claims.

What is claimed is:

1. In a microwave ferrite phase shifter unit, a phase shifter adjustment apparatus comprising in combination:

a ferrite phase shifter means comprising first and second ferrite cores and first and second control coils, said first and second control coils respectively controlling the magnetic field intensity B within said first and second ferrite cores thereby controlling the phase shift therein, said first and second control coils varying the magnetic field intensity B according to the amount of current flowing in said first and second control coils, and a current source means operatively connected to said ferrite phase shifter means, said current source means controlling the polarity and amount of current flowing in said first and second control coils according to the polarity of the drive waveform which is applied to said ferrite phase shifter means.

2. A phase shifter adjustment apparatus as described in claim 1 further including a control means operatively engaged with said current source means to vary the polarity and level of current in said first and second coils as a function of the polarity of the drive waveform.

3. A phase shifter adjustment apparatus as described in claim 2 wherein said current source means comprises first and second constant current sources, said first constant current source being operatively engaged with said first control coil, and said second constant current source being operatively engaged with said second control coil.

4. A phase shifter adjustment apparatus as described in claim 2 wherein said first and second constant current sorces are bidirectional in current flow.

5. A phase shifter adjustment apparatus as described in claim 1 wherein said current source means comprises first and second constant current sources, said first constant current source being operatively engaged with said first control coil, and said second constant current source being operatively engaged with said second control coil.

6. A phase shifter adjustment apparatus as described in claim 5 wherein said first and second constant current sources are unidirectional in current flow.

7. A phase shifter adjustment apparatus as described in claim 5 said first and second constant current sources are respectively in parallel with said first and second control coils.

8. A phase shifter adjustment apparatus as described in claim 5 wherein said first and second constant current sources are respectively in series with said first and second control coils.

9. A phase shifter adjustment apparatus as described in claim 1 wherein said first and second constant current sources are bidirectional in current flow.

10. A phase shifter adjustment apparatus as described in claim 1 wherein said first and second constant current sources are unidirectional in current flow.

11. A phase shifter adjustment apparatus as described in claim 1 wherein said first and second constant current sources are respectively in parallel with said first and second control coils.

12. A phase shifter adjustment apparatus as described in claim 1 wherein said first and second constant current sources are respectively in series with said first and second control coils.

* * * * *